United States Patent

Kikkawa et al.

[11] Patent Number: 5,521,404
[45] Date of Patent: May 28, 1996

[54] GROUP III-V INTERDIFFUSION PREVENTED HETERO-JUNCTION SEMICONDUCTOR DEVICE

[75] Inventors: Toshihide Kikkawa; Hirosato Ochimizu, both of Kawasaki, Japan

[73] Assignee: Fujitsu Limited, Kawasaki, Japan

[21] Appl. No.: 353,156

[22] Filed: Dec. 9, 1994

Related U.S. Application Data

[63] Continuation of Ser. No. 95,530, Jul. 26, 1993, abandoned.

[30] Foreign Application Priority Data

Nov. 30, 1992 [JP] Japan .................... 4-320095

[51] Int. Cl.$^6$ .............. H01L 29/06; H01L 31/0328; H01L 31/072
[52] U.S. Cl. .............. 257/194; 257/18; 257/20; 257/24; 257/192; 257/195
[58] Field of Search ................... 257/192, 194, 257/195, 18, 20, 24

[56] References Cited

U.S. PATENT DOCUMENTS

| | | | |
|---|---|---|---|
| 4,814,838 | 3/1989 | Kuroda et al. | 257/194 |
| 5,023,675 | 6/1991 | Ishikawa | 257/194 |
| 5,099,295 | 3/1992 | Ogawa | 257/194 |
| 5,151,757 | 9/1992 | Enoki et al. | 257/194 |

FOREIGN PATENT DOCUMENTS

| | | | |
|---|---|---|---|
| 0482726 | 4/1992 | European Pat. Off. . | |
| 60-144979 | 7/1985 | Japan | 257/194 |
| 62-213174 | 9/1987 | Japan | 257/192 |
| 1-50570 | 2/1989 | Japan . | |
| 1-49274 | 2/1989 | Japan | 257/194 |
| 1-187878 | 7/1989 | Japan . | |

OTHER PUBLICATIONS

L. F. Luo et al., "P-channel modulation-doped field-effect transistors based on AlSb0.9As0.1/GaSb", IEEE Electron Device Letters, vol. 11, No. 12, Dec. 1990, pp. 567–569, New York, U.S.

J. Dickmann, "Influence of the delta doping position in the channel on the device performance of AlGaAs/InGaAs modulation-doped field-effect transistors", Applied Physics Letters, vol. 60, No. 1, Jan. 6, 1992, pp. 88–90, New York, U.S.

Tan et al, "60–GHz Pseudomorphic AlGaAs/InGaAs Low–Noise HEMT's," IEEE Electron Device Letters, vol. 12, No. 1, Jan. 1991, pp. 23–25.

*Primary Examiner*—Mahshid Saadat
*Attorney, Agent, or Firm*—Staas & Halsey

[57] ABSTRACT

A high electron mobility transistor type group III–V compound semiconductor device includes a substrate of a group III–V compound semiconductor, an electron transfer layer of a group III–V compound semiconductor formed on the substrate, an impurity doped electron supply layer of a group III–V compound semiconductor having a wider band gap and smaller electron affinity than the electron transfer layer, and a spacer layer of a group III–V compound semiconductor having a lattice mismatch with the electron supply layer, the spacer layer being formed between the electron transfer layer and the electron supply layer. A HEMT type group III–V compound semiconductor device is provided which uses an Si-doped electron supply layer of material such as InGaP other than AlGaAs and has good device properties.

14 Claims, 8 Drawing Sheets

GROUP III-V INTERDIFFUSION PREVENTED HETERO-JUNCTION SEMICONDUCTOR DEVICE

This application is a continuation of application No. 08/095,530, filed Jul. 26, 1993, now abandoned.

BACKGROUND OF THE INVENTION a) Field of the Invention

The present invention relates to a group III–V compound semiconductor device, and more particularly to a group III–V compound semiconductor device of a high electron mobility transistor (HEMT) type.

b) Description of the Related Art

A conventional high electron mobility transistor (HEMT) uses mainly i-type GaAs as an electron transfer or travelling layer epitaxially formed on a GaAs substrate, and uses n-type AlGaAs as an electron supply layer epitaxially formed on the electron transfer layer. The term "electron transfer layer" used herein means a layer in which electrons transfer, and the term "electron supply layer" means a layer from which electrons are supplied to the electron transfer layer. Si is generally doped heavily in the electron supply layer as n-type impurities to supply the electron transfer layer with electrons (carriers).

An n-type GaAs cap layer is formed on the electron supply layer. Also formed on the cap layer are source and drain electrodes in ohmic contact with the cap layer and a gate electrode in Schottky contact with the cap layer. A spacer layer is sometimes inserted between the electron transfer layer and electron supply layer. The spacer layer has the same composition as the electron supply layer except that it does not contain impurities.

A deep energy level called a DX center is formed in an Si-doped AlGaAs. The device properties of an AlGaAs/GaAs based HEMT are limited by the DX center. The DX center greatly degrades the device properties when the device is operated at a low temperature such as at the temperature of liquid nitrogen.

From this reason, a HEMT with an electron supply layer not containing the DX center has drawn attention. As such an electron supply layer not containing the DX center, InGaP or InAlAs based material has been considered.

For the mass production of InGaP based HEMTs, it is preferable to use metal organic vapor phase epitaxy (MOVPE) which can use P which has a high vapor pressure and is flammable. For the uniform growth, reduced pressure MOVPE in a depressurized furnace is required to be performed.

Phosphine ($PH_3$) generally used as a source of P has a high decomposition temperature. Therefore, in a depressurized furnace having a high flow velocity, most of phosphine passes over a substrate before it is decomposed sufficiently.

In order for P to be supplied sufficiently, it is necessary to supply a great amount of phosphine. Supplying a sufficiently large amount of phosphine as the P source allows a high quality InGaP layer to be grown.

However, the device properties of an InGaP based HEMT actually manufactured are not so good as expected. Such a difficult issue was reported by many researchers. The phenomenon that the device properties of a HEMT using an Si-doped InGaP electron supply layer are inferior to those of a HEMT using an undoped InGaP electron supply layer may be reasoned at least partially from the presence of Si.

In order to suppress the effects of solid phase diffusion of Si, it is known to insert an undoped InGaP spacer layer between an Si-doped InGaP electron supply layer and i-type GaAs electron transfer layer. Also in this case, the device properties are degraded if the thickness of the spacer layer is as thin as 50 angstroms or less.

If the doping amount of Si is set to $1*10^{17}$ $cm^{-3}$, a good mobility of about 23000 $V^2cm^{-1}s^{-1}$ can be obtained at 77K, but the two dimensional electron gas concentration becomes as low as $5*10^{11}cm^{-2}$. The low concentration of two dimensional electron gas lowers a transfer conductance and the like of a HEMT device to the extent that the device becomes improper in practical use. The two dimensional electron gas concentration is preferably 1 to $2*10^{12}cm^{-2}$ or higher.

If the doping amount of Si is increased to $1.4*10^{18}cm^{-3}$, a sufficient two dimensional electron gas concentration of $1.8*10^{12}cm^{-3}$ can be obtained at 77K, but the mobility lowers to 1400 $V^2cm^{-1}s^{-1}$.

As above, one of the two dimensional electron gas concentration and mobility can be improved by adjusting the doping level of Si, but the other factor is degraded to the degree of inability of practical use.

It has been proposed to use an undoped AlGaAs as the spacer layer for the prevention of Si diffusion from an Si-doped InGaP electron supply layer. However, if Si is diffused in AlGaAs, the DX center is generated resulting in a hardship of operation at a low temperature such as at the temperature of liquid nitrogen.

The present main trend is to reduce the thickness of the non-doped spacer layer as thin as possible, in a typical case to zero, because this structure provides a high concentration of two dimensional electron gas, making an undoped AlGaAs spacer layer out-of-date. An interface control becomes therefore very important in order to realize a good device property without using the non-doped spacer layer.

A technology of manufacturing a novel HEMT not using an Si-doped AlGaAs electron supply layer has not been developed to a sufficient level up to date.

SUMMARY OF THE INVENTION

It is an object of the present invention to provide a group III–V compound HEMT device with good properties by using an electron supply layer made of material other than Si-doped AlGaAs.

According to one aspect of the present invention, there is provided a group III–V compound semiconductor device of a high electron mobility transistor (HEMT) type comprising a substrate of a group III–V compound semiconductor, an electron transfer layer of a group III–V compound semiconductor formed on the substrate, an electron supply layer of a group III–V compound semiconductor doped with impurities and having a wider band gap and smaller electron affinity than the electron transfer layer, and a spacer layer of a group III–V compound semiconductor formed between the electron transfer layer and electron supply layer and having distortions caused by a lattice mismatch with the electron supply layer.

Insertion of the spacer layer with distortions between the electron supply layer and electron transfer layer improves the properties of a group III–V compound semiconductor device of a high mobility transistor (HEMT) type.

It is conceivable that the spacer layer with distortions is effective for preventing solid phase diffusion of n-type impurities from the electron supply layer. It is possible to manufacture a HEMT type group III–V compound semiconductor device with good properties by using material not generating a DX center.

BRIEF DESCRIPTION OF THE DRAWINGS

FIG. 1A is a schematic diagram in section showing the laminated structure of an embodiment device, and FIG. 1B is a schematic diagram in section showing the structure of a HEMT type semiconductor device.

FIG. 2A is a schematic diagram in section showing the laminated structure in a HEMT type semiconductor device according to a conventional technique, FIG. 2B is a graph showing the composition distribution at the region near the interface between the spacer layer and electron transfer layer, FIG. 2C is a graph showing the potential distribution of the conduction band at the region near the interface between the spacer layer and electron transfer layer, and FIG. 2D is a diagram showing the ideal potential distribution of the conduction band at the region near the spacer layer and electron transfer layer.

FIG. 4A is a schematic diagram in section showing the laminated structure of an embodiment device, and FIG. 4B is a graph showing a change in the two dimensional gas concentration and electron mobility with the composition of the spacer layer.

DETAILED DESCRIPTION OF THE PREFERRED EMBODIMENTS

Figure 1A:
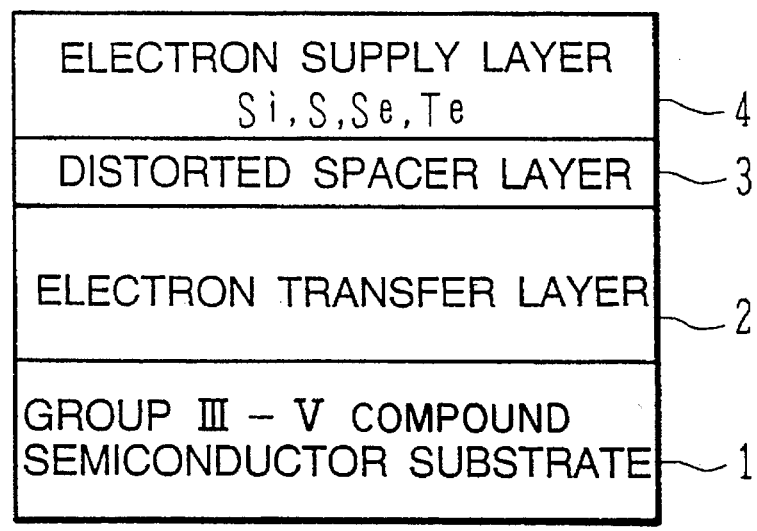
FIGS. 1A and 1B illustrate the fundamental structure of an embodiment according to the present invention.
Figure 1B:
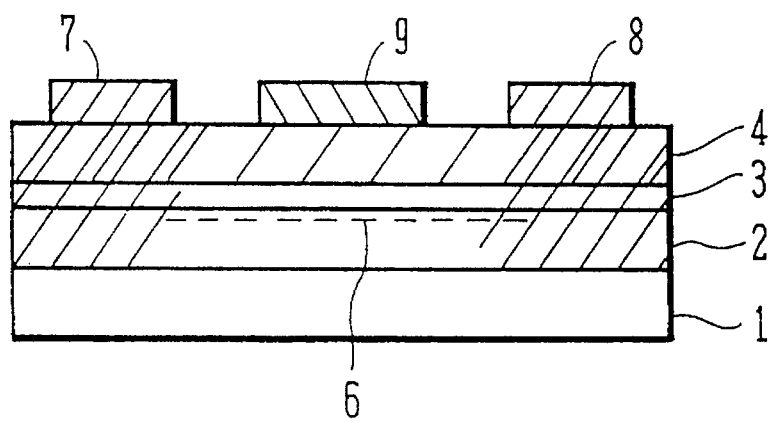

FIGS. 1A and 1B illustrate the fundamental structure of a HEMT type group III–V compound semiconductor device according to an embodiment of the present invention. FIG. 1A is a schematic diagram in section showing the laminated structure of an embodiment device formed on a substrate, and FIG. 1B is a schematic diagram in section showing the structure of a HEMT type semiconductor device.

Referring to FIG. 1A, formed on a group III–V compound semiconductor substrate 1 is an epitaxially laminated structure of an electron transfer layer 2, a distorted spacer layer 3 with distortions, and an electron supply layer 4. The substrate 1 is a semiinsulating substrate for example, and the electron transfer layer 2 is of an i-type with impurities intentionally undoped. The distorted spacer layer 3 has distortions caused by a lattice mismatch with the electron supply layer. The degree of distortion is preferably so large that solid state impurity diffusion can be effectively stopped at the distorted layer. The electron supply layer 4 contains at least one type of impurities selected from the group consisting of Si, S, Se, and Te.

The distorted spacer layer 3 and electron supply layer 4 have a wider band gap and smaller electron affinity than the electron transfer layer 2. Electrons provided by n-type impurities doped in the electron supply layer 4 are therefore drop down into the electron transfer layer to supply this layer with carriers. Impurities may be doped in the distorted spacer layer 3.

The electron transfer layer 2 has a low impurity concentration and high crystallinity. The potential of the conduction band of the electron transfer layer 2 becomes low at the interface to the distorted spacer layer 3 having a wider band gap. Therefore, electrons supplied from the electron supply layer 4 distribute as two dimensional electron gas near at the interface to the electron transfer layer 2. If impurities are doped also in the distorted spacer layer 3, electrons are supplied also from this layer 3 and become two dimensional electron gas in the electron transfer layer 2.

The laminated structure shown in FIG. 1A is used for manufacturing a HEMT such as shown in FIG. 1B. Referring to FIG. 1B, formed on the electron supply layer 4 are source and drain electrodes 7 and 8 in ohmic contact with the layer 4 and a gate electrode between the source and drain electrodes in Schottky contact with the layer 4. Two dimensional electron gas 6 distributes in the region of the electron transfer layer 2 near at the interface to the distorted spacer layer 3.

Figure 2A:
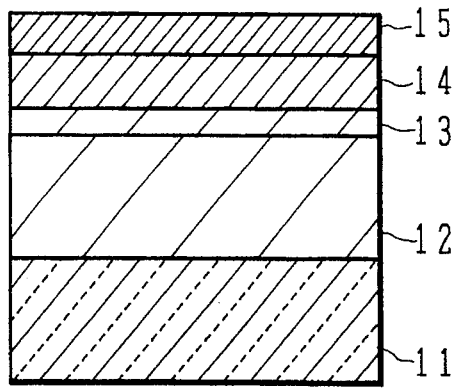
FIGS. 2A to 2D illustrate an analysis of a conventional technique.
Figure 2C:
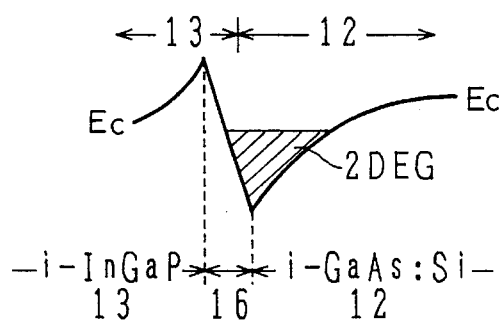
Figure 2B:
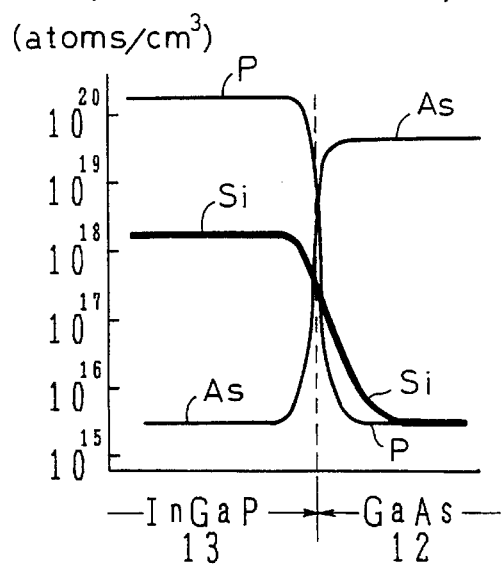

An analysis of a conventional technique will first be described prior to giving a description of the properties of an embodiment HEMT described above. FIGS. 2A to 2D illustrate an analysis of a conventional technique. FIG. 2A is a schematic diagram in section silowing the laminated structure of a HEMT type semiconductor device according to a conventional technique, FIG. 2B is a graph showing the composition distribution of the device, and FIG. 2C is a graph showing the potential distribution in the laminated structure as estimated from the composition distribution.

Referring to FIG. 2A, formed on a semiinsulating GaAs substrate 11 is an epitaxially laminated structure of an i-type GaAs electron transfer layer 12, an i-type InGaP spacer layer 13, an n-type InGaP electron supply layer 14, and an n-type GaAs cap layer 15.

The i-type InGaP spacer layer 13 and n-type InGaP electron supply layer 14 have the composition of $In_{0.49}Ga_{0.51}P$ having a lattice match with the GaAs substrate 11. The spacer layer 13 has the same composition as that of the electron supply layer 14, but it is not doped with n-type impurities. For example, Si is used as n-type impurities.

The graph shown in FIG. 2B shows the analysis results of the composition distribution in the laminated structure of a sample HEMT such as shown in FIG. 2A. The analysis was made by secondary ion mass spectrometery (SIMS). The right side area of the graph represents a GaAs region of the electron transfer layer 12, and the left side area represents an i-type InGaP region of the spacer layer 13.

Although n-type impurity Si is doped only in the electron supply layer 14, it distributes at a fairly high level near at the interface between the spacer layer 13 and electron transfer layer 12, and goes deeply into the electron transfer layer 12. The composition P of the spacer layer 13 does not completely disappear at the interface, but diffuses into the electron transfer layer 12. Similarly, the composition As of the electron transfer layer 12 changes its distribution at the interface and goes into the spacer layer 13.

The compositions of the GaAs electron transfer layer and InGaP spacer layer diffuse near at the interface and form a region having mixed compositions, without forming a desired sharp heterojunction near at the interface. Namely, it is conceivable that an In-Ga-As-P layer is formed near at the interface.

FIG. 2C shows the potential distribution of the conduction band at such an interface region. An In-Ga-P-As interface region 16 has more InGaP compositions on the InGaP spacer layer 13 side and has more GaAs compositions on the GaAs electron transfer layer 12 side. It is therefore supposable that the potential of the conduction band continuously changes from the InGaP spacer layer 13 side to the GaAs electron transfer layer 12 side.

With such a composition change, the potential of the conduction band near at the interface gradually changes to expand the width of the region in which two dimensional electron gas is stored. It is supposed that the electron mobility in the In-Ga-P-As region greatly reduces because of the irregularity or the like of compositions and crystals in this region.

Figure 2D:
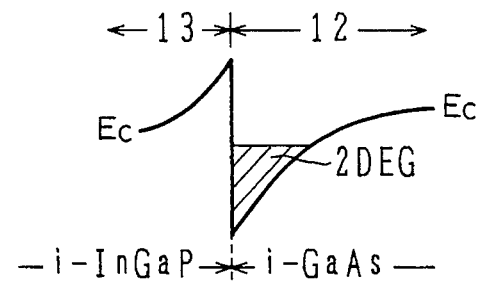

FIG. 2D shows an ideal potential distribution of the conduction band at the interface. The potential distribution of the conduction band abruptly changes at the transition from the spacer layer 13 to the electron transfer layer 12. Two dimensional electron gas distributes in a very narrow region near the interface. Such two dimensional electron gas provides a high electron mobility.

Figure 3A:
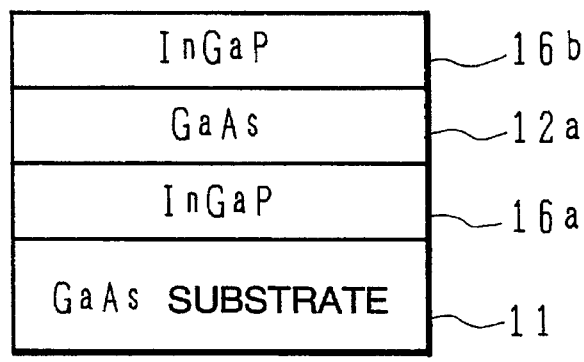
FIGS. 3A to 3C are schematic diagrams in section showing the structures of test samples used for the confirmation of the analysis of the conventional technique.
Figure 3B:
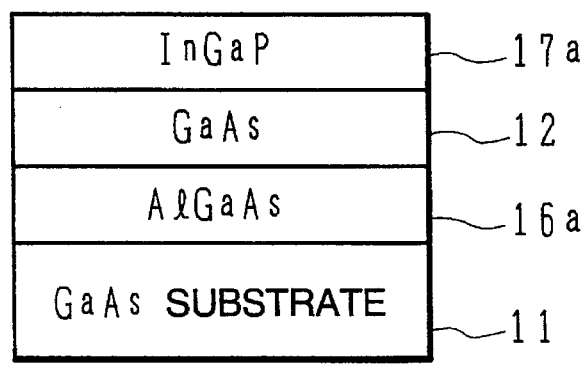
Figure 3C:
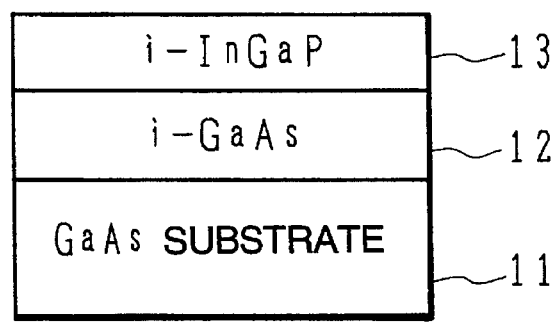

FIGS. 3A to 3C show the structures of test samples used for the study of mixed compositions near at the interface.

The test sample shown in FIG. 3A has a laminated structure of an InGaP layer 16a, a GaAs layer 12a, and an InGaP layer 16b, sequentially formed on a GaAs substrate 11. No n-type impurity is doped in this laminated structure. With this laminated structure with n-type impurities undoped, the quality of quantum well formed by the GaAs layer 12a was good.

The test sample shown in FIG. 3B has an AlGaAs/GaAs heterojunction of a conventional HEMT and an InGaP/GaAs heterojunction of a novel HEMT.

This test sample has a laminated structure of an AlGaAs layer 16a, a GaAs layer 12, and an InGaP layer 17a, sequentially formed on a GaAs substrate 11. Each layer is not doped with impurities. With this laminated structure, the quality of quantum well formed by the GaAs layer 12 was good.

The structure of the test sample shown in FIG. 3C was obtained in the following manner. An i-type GaAs electron transfer layer 12 was epitaxially grown by about 6000 angstroms on a GaAs substrate 11, and a thick i-type InGaP layer 13 functioning as a spacer layer was epitaxially grown by about 4000 angstroms on the i-type GaAs electron transfer layer 12.

Although the i-type InGaP spacer layer 13 was not doped with impurities, it has a carrier concentration of n= $5*10^{16} cm^{-3}$. With this structure, a good mobility of two dimensional electron gas was obtained.

As the conclusion of the study of these test samples, it is conceivable that a good interface property can be obtained if impurities such as Si are not doped in the electron supply layer. It is supposed therefore that the disturbance of the interface property is caused by the diffusion of doped n-type impurities such as Si.

The composition of an InGaP electron supply layer formed on a GaAs substrate is $In_{0.49}Ga_{0.51}P$, and so In and Ga are irregularly distributed. The atom radius of In is greater than Ga so that the space between P and In is different from that between P and Ga.

Therefore, in an IIIGaP crystal with irregularly distributed In and Ga, group III atoms cannot occupy regular group III sites and are supposed to displace their positions.

It becomes therefore easy for n-type impurities such as Si to diffuse in such a crystal having different spaces between atoms. As Si diffuses in the crystal, other elements such as In, P, Ga, and As are supposed to diffuse in the crystal. This causes the disturbance of the composition distribution such as shown in FIG. 2B and forms an In-Ga-As-P region at the interface.

In order for a HEMT to have a sharp heterojunction and good property, it is conceivably effective if the diffusion of n-type impurities such as Si is avoided. To this end, as shown in FIG. 1A, the distorted spacer layer 3 is formed to prevent the n-type impurities in the electron supply layer 4 from being diffused into the electron transfer layer 2. It is also possible to use a distorted spacer layer 3 with doped impurities i.e. without using a non-doped layer, and prevent the diffusion of impurities from being diffused in the electron transfer layer 2.

Figure 4A:
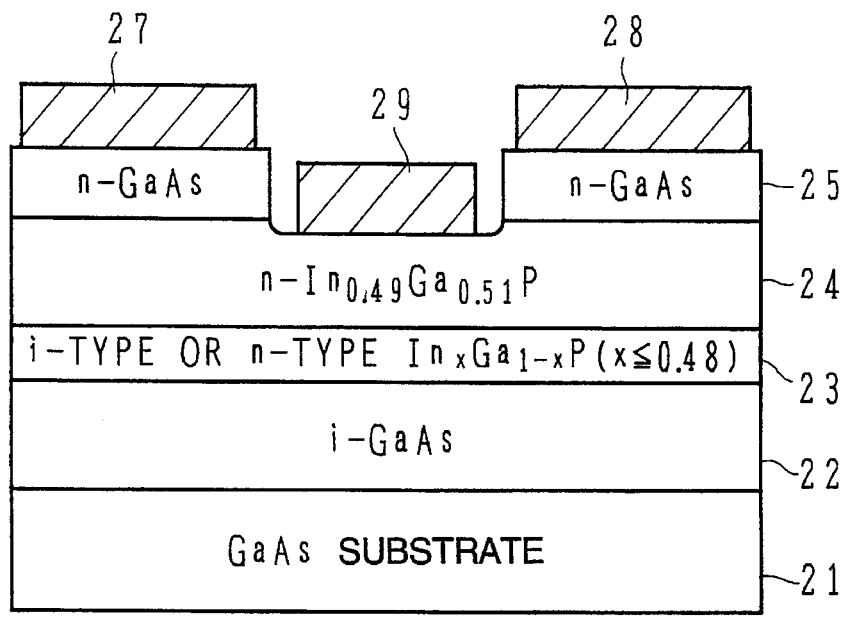
FIGS. 4A and 4B illustrate a HEMT type semiconductor device according to an embodiment of the present invention.
Figure 4B:
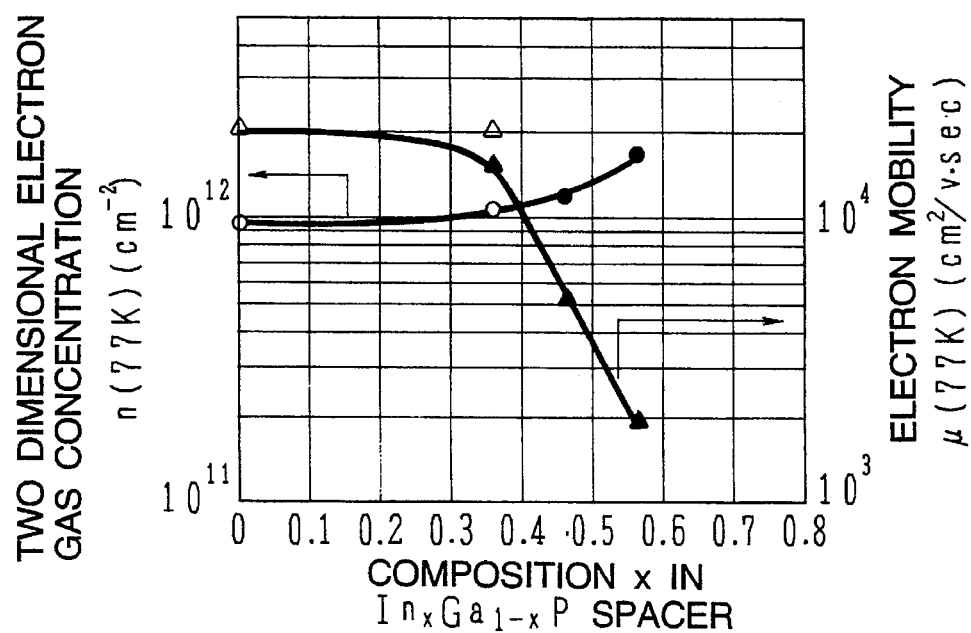

FIGS. 4A and 4B illustrate a HEMT type semiconductor device according to an embodiment of the present invention. FIG. 4A is a cross section showing the laminated structure of the embodiment device. and FIG. 4B is a graph showing the property of the device relative to the compositions of the spacer layer.

Referring to FIG. 4A, an i-type GaAs electron transfer layer 22 is formed on a semiinsulating GaAs substrate 21 to a thickness of 6000 angstroms, and a distorted spacer layer 23 of i-type $In_xGa_{1-x}P$ ($x \leq 0.48$) is formed on the electron transfer layer 22 to a thickness of about 25 angstroms.

An electron supply layer 24 is formed on the distorted spacer layer 23. The electron supply layer 24 is doped with Si and has a composition of n-type $In_{0.49}Ga_{0.51}P$ having a lattice match with the GaAs substrate 21. The surface of the electron supply layer 24 is covered with an n-type GaAs cap layer 25 having a thickness of about 50 angstroms.

This laminated structure may be grown by using a depressurized barrel type MOCVD furnace. As a group III source, trimethylgallium (TMGa), triethlgallium (TEGa), triethylindium (TMIn), or the like may be used. As a group V source, phosphinc, arsinc, or the like may be used. In the following embodiments, the growth temperature was set to 650° C.

The distorted spacer layer 23 has a value x smaller than x=0.49 at which the lattice matching with the electron supply layer 24 is obtained. Typically, x is selected not greater than 0.48. The distorted spacer layer 23 has therefore a smaller lattice constant, and distortions caused by a lattice mismatch with the electron supply layer.

The cap layer 25 and surface layer of the electron supply layer 24 are selectively etched to expose a surface of the electron supply layer 24. A source and drain chmic electrodes are formed on the cap layer 25 sandwiching the exposed electron supply layer 24 and a gate Schottky electrode 29 is formed on the exposed surface of the electron supply layer 24.

FIG. 4B is a graph showing the two dimensional electron gas concentration and electron mobility at 77K relative to the composition x of the distorted spacer layer 23 at x=0.36, 0.46, and 0.56. The electron mobility lowers rapidly near from the composition x=0.4.

At x=0.49 at which the lattice matching with GaAs is obtained, the electron mobility lowers greatly. The two dimensional electron gas concentration tends to increase as the composition x increases. It is preferable for the two dimensional electron gas concentration of a HEMT to be set to about 1 to $2*10^{12}$. This level of the two dimensional electron gas concentration can be obtained by the structure shown in FIG. 4A.

It may be noted that the electron mobility decreases with an increase of x from the region of x greater than about 0.4. The tendency of mobility decreases continues over the composition x=0.49 at which lattice matching occurs.

It can be construed from the above that it is more preferable to use a low concentration of In. The relationship between the electron mobility and distortions in the range in excess of x=0.49 is not certain and demands future studies. In the range of x=0.48, however, the electron mobility increases as the composition is set more apart from the composition x=0.49 at the lattice matching, i.e., as the degree of distortions becomes greater.

Figure 5A:
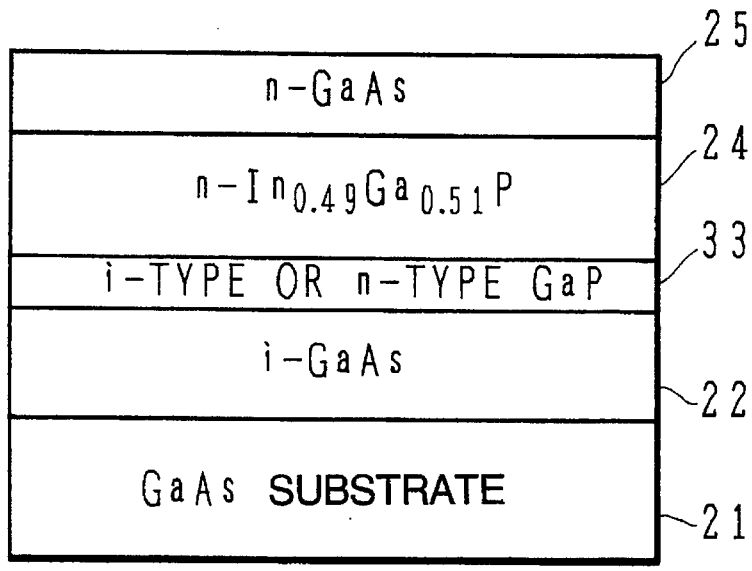
FIGS. 5A and 5B are schematic diagrams in section showing the structures of HEMT type semiconductor devices according to other embodiments of the present invention.
Figure 5B:
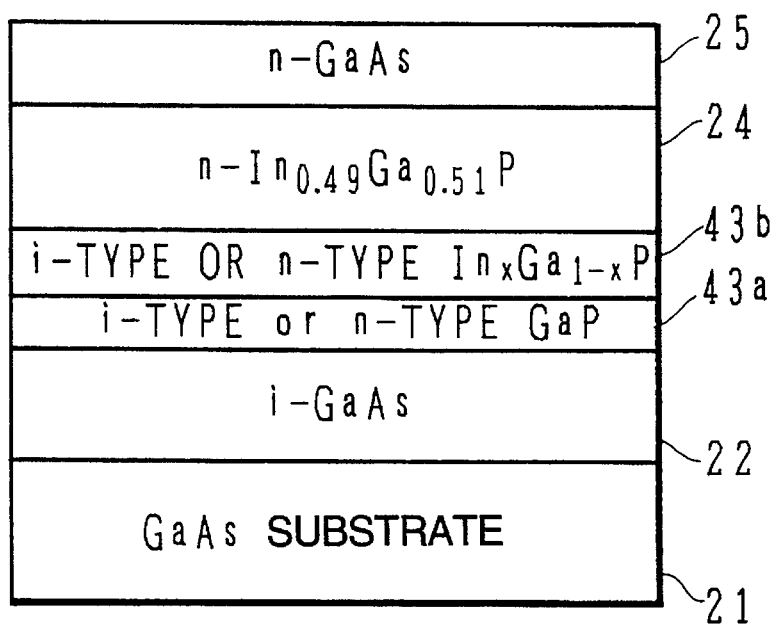

FIGS. 5A and 5B are schematic diagrams showing the fundamental structures of HEMTs according to other embodiments. FIG. 5A shows the structure with a distorted GaP mono-molecular layer. On a GaAs substrate 21, an i-type GaAs electron transfer layer 22 is formed. On the electron transfer layer 22, a distorted spacer layer 33, an n-type $In_{0.49}Ga_{0.51}P$ electron supply layer 24, and an n-type GaAs cap layer 25 are formed in this order, like the embodiment shown in FIG. 4A. Electrodes may be formed similar to FIG. 4A.

The distorted spacer layer 33 of this embodiment is constituted by a mono-molecular layer of GaP. GaP has a large lattice mismatch with a GaAs substrate so that a very thin layer is used in order not to exceed a critical film thickness. Although a mono-molecular layer is used in this embodiment, a two-molecular layer may also be used.

The two dimensional electron gas concentration and mobility were measured for the embodiment using the GaP distorted spacer layer 33. The measured values are indicated at x=0 in FIG. 4B. These values are coincident with those of the embodiment shown in FIG. 4A.

The structure shown in FIG. 5B is a combination of the structures shown in FIG. 4A and 5A. An i-type GaAs electron transfer layer 22 is formed on a semiinsulating GaAs substrate 21. Formed on the electron transfer layer 22 is a distorted spacer layer 43a of mono-molecular GaP layer on which another distorted spacer layer 43b of i-type $In_xGa_{1-x}P$ (x≦0.48) is formed. The distorted spacer layer of this embodiment is made of two layers, one being a mono-molecular GaP layer and the other being InGaP with an In composition x being smaller than the lattice matching composition.

On the distorted spacer layers 43a and 43b, an Si-doped n-type $In_{0.49}Ga_{0.51}P$ electron supply layer 24 and an n-type GaAs cap layer 25 are formed.

GaP has a large lattice mismatch with a GaAs substrate so that only a very thin layer can be used. A distorted spacer layer having a sufficient thickness can be formed by using two distorted layers, i.e. the GaP mono-molecular layer and i-type $In_xGa_{1-x}P$ layer.

Figure 6A:
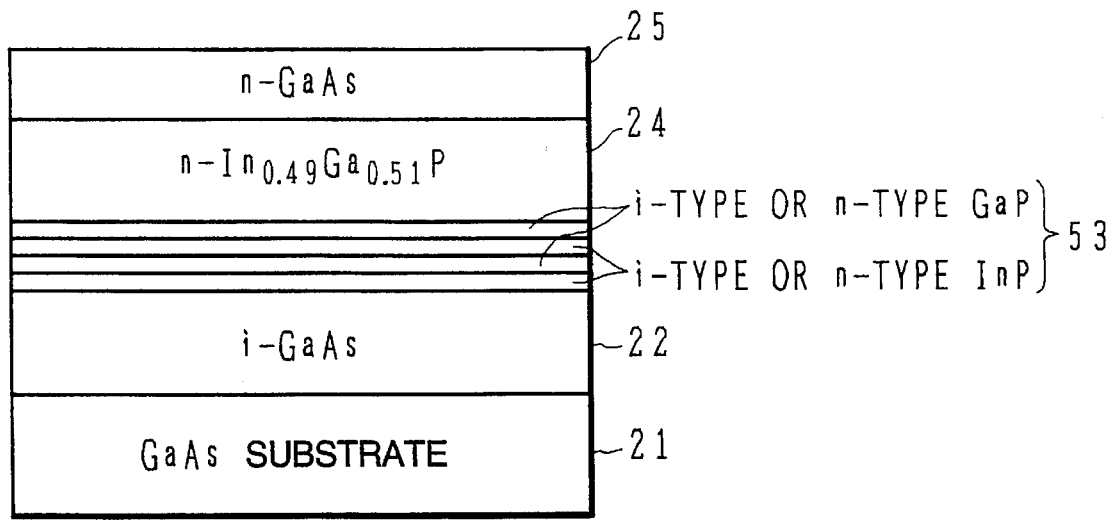
FIGS. 6A and 6B are schematic diagrams in section silowing the structures of HEMT type semiconductor devices according to other embodiments of the present invention.
Figure 6B:
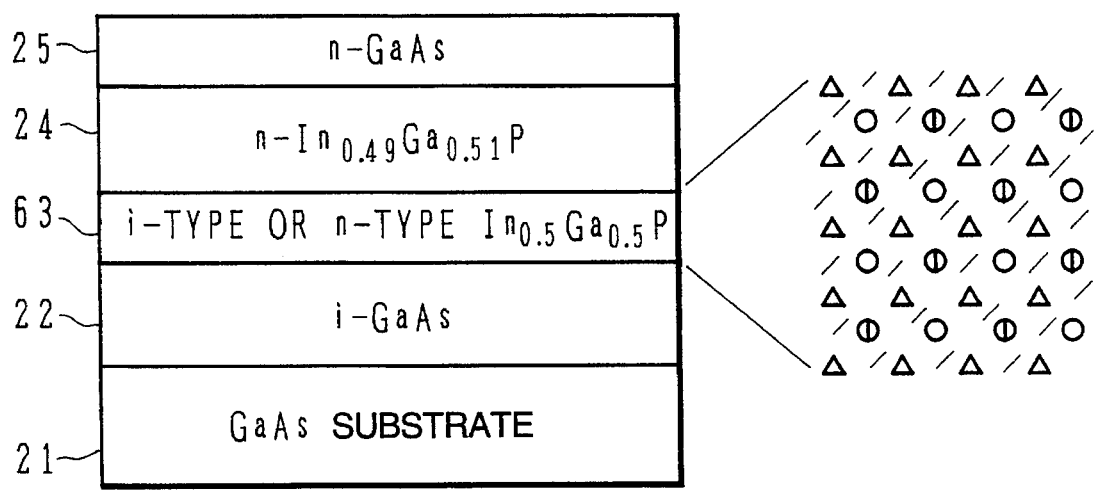

FIGS. 6A and 6B show the structures of HEMTs according to other embodiments of the present invention.

Referring to FIG. 6A, on a semiinsulating GaAs substrate 21, there is formed an i-type GaAs electron transfer layer 22 on which a superlattice distorted spacer layer 53 is formed. This superlattice distorted spacer layer 53 is made of alternating layers of an i-type InP layer and an i-type GaP layer.

Although only four layers in the superlattice are shown, the number of layers in the superlattice may be much more.

With the superlattice structure, it is possible to form a distorted spacer layer having a sufficient thickness by using the InP and GaP layer having a high lattice mismatch with the GaAs substrate 21.

On the distorted spacer layer 53, there are formed an Si-doped n-type $In_{0.49}Ga_{0.51}P$ electron supply layer 24 and an n-type GaAs cap layer 25. Electrodes may be formed similar to FIG. 4A.

In this embodiment, the distorted lattice layer has the superlattice structure. It is conceivable that n-type impurities diffused from the electron supply layer 24 can be trapped not only by the distortions but also by a number of interfaces of the superlattice structure. Such a superlattice structure may be formed by molecular beam epitaxy (MBE), gas source MBE, or other methods.

Referring to FIG. 6B, an i-type GaAs electron transfer layer 22 is formed on a semiinsulating GaAs substrate 21. Thereafter, a distorted spacer layer 63 of a natural superlattice layer of i-type $In_{0.5}Ga_{0.5}P$ is formed. On the distorted spacer layer 63, there are formed an n-type $In_{0.49}Ga_{0.51}P$ electron supply layer 24 and an n-type GaAs cap layer 25. Electrodes may be formed similar to FIG. 4A.

$In_{0.5}Ga_{0.5}P$ has a characteristic of forming a natural superlattice in the [110] direction when it is grown on the [111]A plane. The structure of the natural superlattice is shown enlarged at the right side of FIG. 6B.

In the distorted spacer layer using the superlattice structure shown in FIGS. 6A and 6B, the lattice sites of group III In and Ga elements are no more irregular, but they take regular positions. Irrespective of a mixed crystal, a crystal having regular lattice sites can be formed. In such a regular crystal, the diffusion of impurities such as Si can be reduced considerably.

In the above description, GaAs is used as the electron transfer layer and InGaP is used as the electron supply layer. Other materials may also be used in forming a HEMT. Furthermore, although the distorted spacer layer with impurities undoped is used in the above embodiments, the advantageous effects of this invention can also be obtained even if impurities are doped in the distorted spacer layer. Indication or "or n-" in these figures shows this alteration.

Figure 7A:
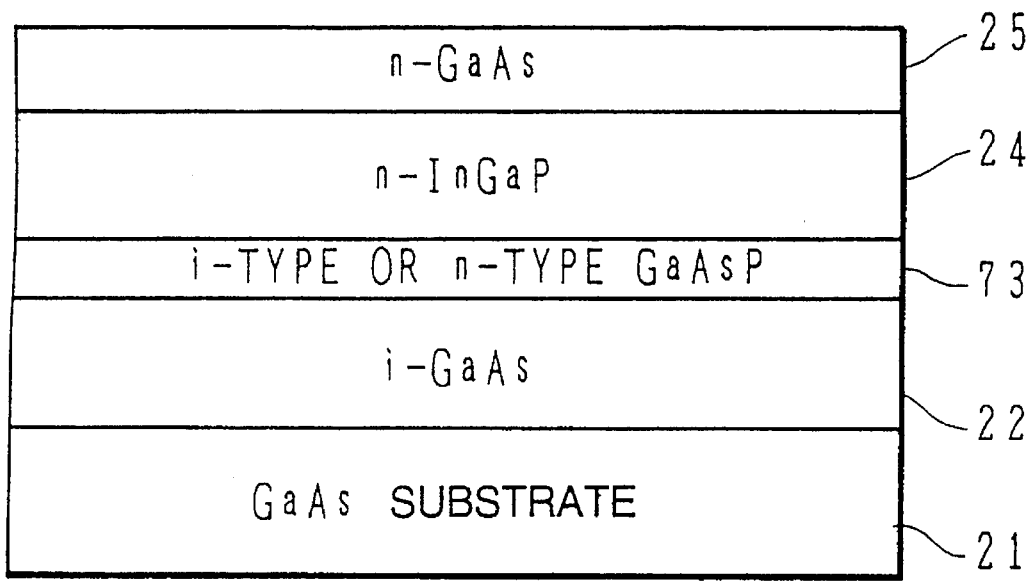
FIGS. 7A and 7B are schematic diagrams in section showing the structures of HEMT type semiconductor devices according to other embodiments of the present invention.

FIGS. 7A and 73 illustrate other embodiments using group III-V compound semiconductors different from the above embodiments. Referring to FIG. 7A, formed on a semiinsulating GaAs substrate 21 is an i-type GaAs electron transfer layer 22 on which an i-type GaAsP distorted spacer layer 73 is formed. GaAsP may be intrinsic (i-type) or doped with n-type impurities.

On the distorted spacer layer 73, there are formed an Si-doped n-type InGaP electron supply layer 24 and an n-type GaAs cap layer, respectively having a lattice match with the GaAs substrate. In the GaAsP distorted spacer layer 73, it is expected that the diffusion of n-type impurities such as Si can be reduced because the distorted spacer layer 73 does not contain In.

The two dimensional electron gas concentration of $1.2*10^{12} cm^{-2}$ and a mobility of 32000 $V^2 cm^{-1} s^{-1}$ were obtained at 77K by using the i-type GaAs electron transfer layer 22 of a thickness of 6000 angstroms, the i-type GaAsP distorted spacer layer 73 of a thickness of 25 angstroms, the Si-doped InGaP electron supply layer 24 of a thickness of 350 angstroms, and the GaAs cap layer 25 of a thickness of 50 angstroms. Although Si was doped in GaAsP, a high two dimensional electron gas concentration of $1.4*10^{12} cm^{-2}$ and a high mobility of 20000 $V^2 cm^{-1} s^{-1}$ were obtained.

These values are sufficient for the two dimensional electron gas concentration and mobility for a HEMT. Also in this embodiment, it is supposed that the impurity diffusion can be suppressed by the distorted spacer layer and that a good heterojunction structure can be obtained.

Figure 7B:
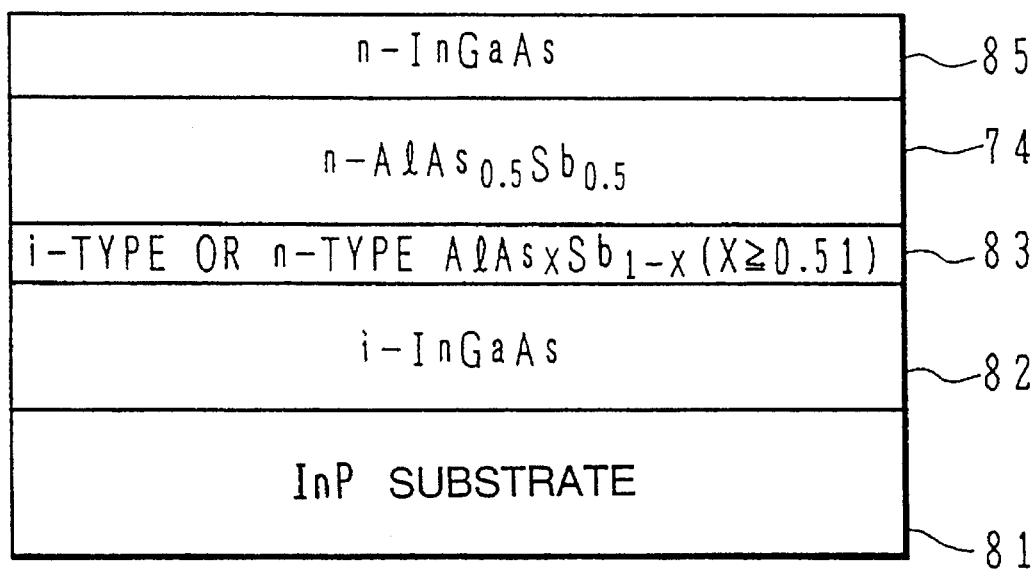

Referring to FIG. 7B, a semiinsulating InP substrate 81 is used. On this substrate, there is formed an i-type InGaAs electron transfer layer 82 having a lattice match with InP. On the electron transfer layer 82, a distorted spacer layer 83 is formed by i- or n-type $AlAs_xSb_{1-x}$ ($x \geq 0.51$) having a smaller lattice constant than that of the substrate 81.

Formed on the distorted spacer layer 83 are an Si-doped n-type $AlAs_xSb_{1-x}$ layer 84 (x=0.5) and an n-type InGaAs cap layer 85, respectively having a lattice match with the InP substrate 81. The layers other than the distorted spacer layer 83 has a lattice match with the substrate 81.

Figure 8:
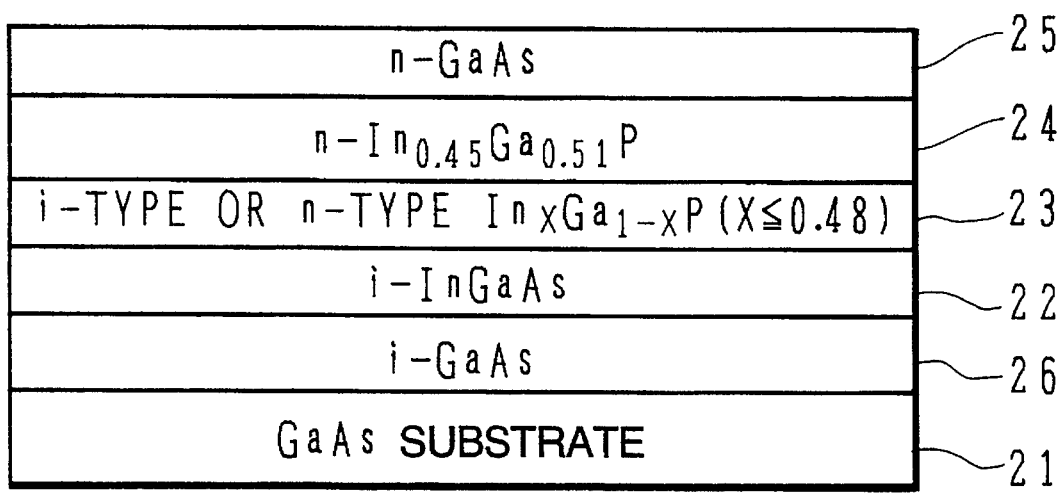
FIG. 8 is a schematic diagram in section showing the structure of a HEMT type semiconductor device according to another embodiment of the present invention.

FIG. 8 illustrates another embodiment in which the electron transfer layer has distortions. In this embodiment, an InGaAs electron transfer layer is used instead of the i-type GaAs layer of the embodiment shown in FIG. 4A. This embodiment is suitable for use as a device structure providing a high two dimensional electron gas concentration. With the distorted spacer layer 23, the two dimensional electron gas concentration of $1.8*10^{12} cm^{-2}$ and a mobility of 15000 $V^2 cm^{-1} s^{-1}$ were obtained. The distorted spacer layer of this sample was not doped with impurities. Reference numeral 26 represents a buffer layer.

The materials used in the above embodiments are not intended to limit the scope off the present invention. For example, it is particularly efffective to use the material likely to form a natural superlattice as the material of the electron supply layer while using the distorted spacer layer. As the material of the electron transfer layer to be formed on the InP substrate, InP, InAsP or the like as well as InGaAs may also be used.

As n-type impurities, S, Se, Te, and the like as well as Si may also be used. As the material of the electron supply layer, $(Al_yGa_{1-y})_xIn_{1-x}P$, $In_xGa_{1-x}P$, and the like may also be used.

It is obvious that other crystal growth apparatuses may also be used instead of the depressurized barrel furnace.

The present invention has been described in connection with the above embodiments. The invention is not limited only to the embodiments, but it is apparent for those skilled in the art that various changes, improvement, combinations, and the like may be made without departing from the spirit and scope off the present invention.

We claim:

1. A high electron mobility transistor type group III–V compound semiconductor device, comprising:

a substrate of a group III–V compound semiconductor;

an electron transfer layer of a group III–V compound semiconductor including a first group V element formed on said substrate;

an impurity doped electron supply layer of a group III–V compound semiconductor including a second group V element that is different than said first group V element, said supply layer having a wider band gap and smaller electron affinity than said electron transfer layer and being disposed on said electron transfer layer; and a spacer layer of a group III–V compound semiconductor having a lattice mismatch with said electron supply layer and with said electron transfer, said spacer layer being formed between said electron transfer layer and said electron supply layer.

2. A high electron mobility transistor type group III–V compound semiconductor device according to claim 1, wherein said spacer layer is doped with impurities.

3. A high electron mobility transistor type group III–V compound semiconductor device according to claim 1, wherein said substrate is a GaAs substrate, said electron transfer layer is a GaAs layer, and said electron supply layer is an InGaP layer.

4. A high electron mobility transistor type group III–V compound semiconductor device according to claim 3, wherein said spacer layer includes at least one of an $In_xGa_{1-x}P$ layer, where $x \leq 0.48$, a GaP mono-molecular layer, a superlattice layer, and a GaAsP layer.

5. A semiconductor device according to claim 4, wherein said spacer layer includes two GaP mono-molecular layers.

6. A high electron mobility transistor type group III–V compound semiconductor device according to claim 1, wherein said electron supply layer is one off an $(Al_yGa_{1-y})_xIn_{1-x}P$ layer and an InAlAs layer.

7. A high electron mobility transistor type group III–V compound semiconductor device according to claim 1, wherein said electron transfer layer is one of an InGaAs layer, an InAsP layer, and an InP layer.

8. A high electron mobility transistor type group III–V compound semiconductor device according to claim 1, wherein said substrate is an InP substrate, said electron transfer layer is one of an InGaAs layer, an InAsP layer, and an InP layer, said electron supply layer is an AlAsSb layer, and said spacer layer is an $AlAs_xSb_{1-x}$ layer, where $x \geq 0.51$.

9. A high electron mobility transistor type group III–V compound semiconductor device, comprising:

a GaAs substrate;

a GaAs electron transfer layer formed on said substrate;

a group III–V compound semiconductor spacer layer on said transfer layer, said spacer layer including at least one of an $In_xGa_{1-x}P$ layer, where $x \leq 0.48$, a GaP mono-molecular layer, a superlattice layer, and a GaAsP layer; and an InGaP electron supply layer doped with n-type impurities and disposed on said spacer layer, said spacer layer thereby having a lattice mismatch with said electron supply layer, said spacer layer being interposed between said electron transfer layer and said electron supply layer to prevent diffusion of said impurities.

10. A high electron mobility transistor type group III–V compound semiconductor device according to claim 9, wherein said spacer layer is doped with Si and has a composition $In_xGa_{1-x}P$, where $x \leq 0.48$.

11. A high electron mobility transistor type group III–V compound semiconductor device comprising:

a substrate essentially consisting of GaAs;

an electron transfer layer formed on said substrate and essentially consisting of one of GaAs and InGaAs;

a spacer layer on said transfer layer; and an electron supply layer essentially consisting of InGaP, doped with n-type impurities disposed on said spacer layer, said spacer layer being of a group III–V compound semiconductor having a lattice mismatch with said electron supply layer, said spacer layer including a superlattice of alternating GaP and InP layers and being interposed between said electron transfer layer and said electron supply layer to prevent diffusion of said impurities.

12. A high electron mobility transistor type group III–V compound semiconductor device according to claim 11, wherein said GaP and InP layers are mono-molecular layers.

13. A high electron mobility transistor type group III–V compound semiconductor device, comprising:

a substrate essentially consisting of InP;

an electron transfer layer essentially consisting of one of InGaAs, InP and InAsP formed on said substrate;

a spacer layer on said transfer layer, said spacer layer having a composition $AlAs_xSb_{1-x}$, where $x \geq 0.51$; and an electron supply layer on said spacer layer, said supply layer essentially consisting of one of AlAsSb, InGaP, AlGaInP, and InAlAs and having a wider band gap and smaller electron affinity than said electron transfer layer and being doped with a dopant comprising at least one of Si, S, Se and Te, said spacer layer being of a group III–V compound semiconductor having a lattice mismatch with said electron supply layer, said spacer layer being capable of preventing diffusion of said dopant and being interposed between said electron transfer layer and said electron supply layer to prevent said diffusion.

14. A semiconductor device as set forth in claim 13, including an InGaAs cap layer on said supply layer.

\* \* \* \* \*

UNITED STATES PATENT AND TRADEMARK OFFICE
CERTIFICATE OF CORRECTION

PATENT NO.   : 5,521,404
DATED        : May 28, 1996
INVENTOR(S)  : Toshihide KIKKAWA et al.

It is certified that error appears in the above-indentified patent and that said Letters Patent is hereby corrected as shown below:

Column 3, line 41, delete "silowing" and substitute --showing--.
Column 8, line 51, delete "73" and substitute --7B--.

Signed and Sealed this

Thirteenth Day of August, 1996

Attest:

BRUCE LEHMAN

Attesting Officer    Commissioner of Patents and Trademarks